(12) United States Patent
Tseng et al.

(10) Patent No.: US 7,135,898 B2
(45) Date of Patent: Nov. 14, 2006

(54) POWER-ON RESET CIRCUIT WITH SUPPLY VOLTAGE AND TEMPERATURE IMMUNITY, ULTRA-LOW DC LEAKAGE CURRENT, AND FAST POWER CRASH REACTION

(75) Inventors: Chien-Chung Tseng, Hsinchu (TW); Chih-Neng Hsu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/609,038

(22) Filed: Jun. 27, 2003

(65) Prior Publication Data

US 2004/0263222 A1  Dec. 30, 2004

(51) Int. Cl.
*H03K 17/22* (2006.01)
*H03K 17/14* (2006.01)

(52) U.S. Cl. ............... 327/143; 327/198; 327/205; 327/513

(58) Field of Classification Search ................ 327/142, 327/143, 198, 205, 513; 323/901, 907; 365/227–229
See application file for complete search history.

(56) References Cited

U.S. PATENT DOCUMENTS

| | | | | |
|---|---|---|---|---|
| 5,166,546 A | * | 11/1992 | Savignac et al. | 327/143 |
| 5,479,172 A | * | 12/1995 | Smith et al. | 342/51 |
| 6,060,925 A | * | 5/2000 | Chou | 327/206 |
| 6,084,446 A | | 7/2000 | Chen et al. | 327/143 |
| 6,144,238 A | * | 11/2000 | Dasgupta | 327/143 |
| 6,157,227 A | * | 12/2000 | Giovinazzi et al. | 327/143 |
| 6,518,823 B1 | * | 2/2003 | Kawai | 327/525 |
| 2003/0174002 A1 | * | 9/2003 | Slamowitz et al. | 327/143 |

* cited by examiner

*Primary Examiner*—Timothy P. Callahan
*Assistant Examiner*—Terry L. Englund
(74) *Attorney, Agent, or Firm*—Stout, Uxa, Byan & Mullins, LLP

(57) ABSTRACT

A power-on reset circuit includes a Schmitt trigger circuit, a voltage divider, and a compensate circuit. The Schmitt trigger circuit includes a plurality of MOS devices of a uniform threshold voltage ($V_t$) for determining a power reset trigger level. The voltage divider is coupled to an input of the Schmitt trigger circuit for tracking the supply signal. The compensate circuit is operative to generate a small reset pulse to compensate for temperature and the supply signal variation effect.

37 Claims, 11 Drawing Sheets

POWER-ON RESET CIRCUIT WITH SUPPLY VOLTAGE AND TEMPERATURE IMMUNITY, ULTRA-LOW DC LEAKAGE CURRENT, AND FAST POWER CRASH REACTION

BACKGROUND OF THE INVENTION

1. Field of the Invention

The present invention relates generally to power supply circuitry and, more particularly, to power-on resets for power supply circuitry.

2. Description of Related Art

Traditionally, an electronic device has required a power supply that provides a relatively constant voltage to the electronic device. In such devices, when power is initially applied to the electronic device, a supply signal increases non-instantaneously from a ground potential to an operational level. When the supply signal exceeds a threshold, a "power-on reset" signal indicates to the various components that sufficient voltage is available on the supply signal. The various components of the electronic device may then initialize to a predetermined state in response to the power-on reset signal. In many electronic devices, each time the power-on reset signal is asserted, the electronic device enters the same predetermined state.

Many electronic devices also have a low power mode, also called a sleep mode or sleep state. When in a low power mode, the supply signal is reduced to a very low level, sufficient to allow some devices to operate but insufficient to allow other components to operate. For example, a computer system may contain a low-power memory that can store session information, recently-modified files, and other data needed to restore the computer system.

When the supply signal is restored to its operational level following a sleep state, it is generally not desirable to assert the power-on reset signal, since the power-on reset signal would return the electronic device to the predetermined state rather than restoring the session. The power-on reset signal might, for example, erase portions of memory that had been used during the session. To avoid this unfortunate result, many electronic devices are designed so that when the voltage of the supply signal increases from the very low "sleep" voltage to a fully operational voltage, the power-on reset signal is suppressed, while when the voltage of the supply signal increases from the ground potential to a fully operational voltage, the power-on reset signal is asserted. Suppressing the power-on reset signal during recovery from a sleep state advantageously prevents re-initialization of memory and other power-on processes that would negate the advantages of the sleep state.

To suppress the power-on reset signal during recovery from a sleep state, various techniques have been used. U.S. Pat. No. 6,084,446 uses two sets of transistors having different threshold voltages. One set of transistors with extremely low threshold voltages is intended to operate even while the computer system is in sleep mode; the gate terminals of these transistors can trigger even when the voltage of the supply signal is very small. The low-threshold transistors provide a non-zero voltage at a node that would be grounded but for the operation of the low-threshold transistors. The other set of transistors, having a normal threshold voltage and having this node at the source terminals, cannot trigger when recovering from the sleep mode but can trigger when recovering from a full power-down state.

Fabricating an integrated circuit with different devices having different threshold voltages can be an expensive and difficult process, possibly requiring multiple mask steps. A need thus exists in the prior art for a power-on reset circuit in which substantially all of the transistors have a uniform threshold voltage, such that the power-on reset circuit can assert a power-on reset signal in response to a supply signal having a sufficient voltage except when recovering from a sleep state. A further need exists for a circuit that generates a power-on reset signal having adequate temperature immunity, ultra-low DC leakage current, and fast power crash reaction.

SUMMARY OF THE INVENTION

The present invention includes a power-on reset circuit that can assert a power-on reset signal in response to an increase in a supply signal when the supply signal has begun its increase at a zero or near-zero voltage (associated with a complete power-down state), and can suppress the power-on reset signal when the supply signal has begun its increase at a nonzero voltage (associated with a sleep state). In other words, the power-on reset signal is asserted in response to a supply signal increasing to an operational voltage from a zero supply voltage associated with a complete power-down state, but does not assert the power-on reset signal in response to the signal increasing to the operational voltage from the nonzero supply voltage associated with the sleep state.

Furthermore, the present invention includes a power-on reset circuit that can assert a power-on reset signal of reduced amplitude in response to a decrease in the supply signal when the supply signal has begun its decrease from the operational voltage to a zero or near-zero voltage (associated with a power-down state), and can assert a power-on reset signal of greater amplitude in response to an increase in the supply signal when the supply signal has begun its increase from a zero or near-zero voltage (associated with a power-down state) to the operational voltage.

The present invention can address the above-stated needs by providing, for example, in accordance with one aspect, a power-on reset circuit in which substantially all of the transistors have a uniform threshold voltage. In another aspect, the power-on reset circuit includes a voltage divider that tracks a supply signal. In accordance with yet another aspect, the power-on reset circuit includes a voltage divider that can provide an ultra-low DC leakage current while tracking the supply signal. According to one aspect of the present invention, a Schmitt trigger circuit can obviate any need for non-uniform threshold voltages by providing, for example, one trigger threshold when recovering from a full power down and another trigger threshold for recovering from a low power state. The Schmitt trigger circuit can further provide another trigger process when transitioning from an operational power to a full power down state. A compensate circuit in accordance with another aspect of the present invention can provide thermal compensation in response to variations in temperature.

Any feature or combination of features described herein are included within the scope of the present invention provided that the features included in any such combination are not mutually inconsistent as will be apparent from the context, this specification, and the knowledge of one of ordinary skill in the art. For purposes of summarizing the present invention, certain aspects, advantages and novel features of the present invention have been described herein. Of course, it is to be understood that not necessarily all such aspects, advantages or features will be embodied in any particular embodiment of the present invention. Additional advantages and aspects of the present invention are apparent in the following detailed description and claims.

DETAILED DESCRIPTION OF THE PRESENTLY PREFERRED EMBODIMENTS

Figure 1:
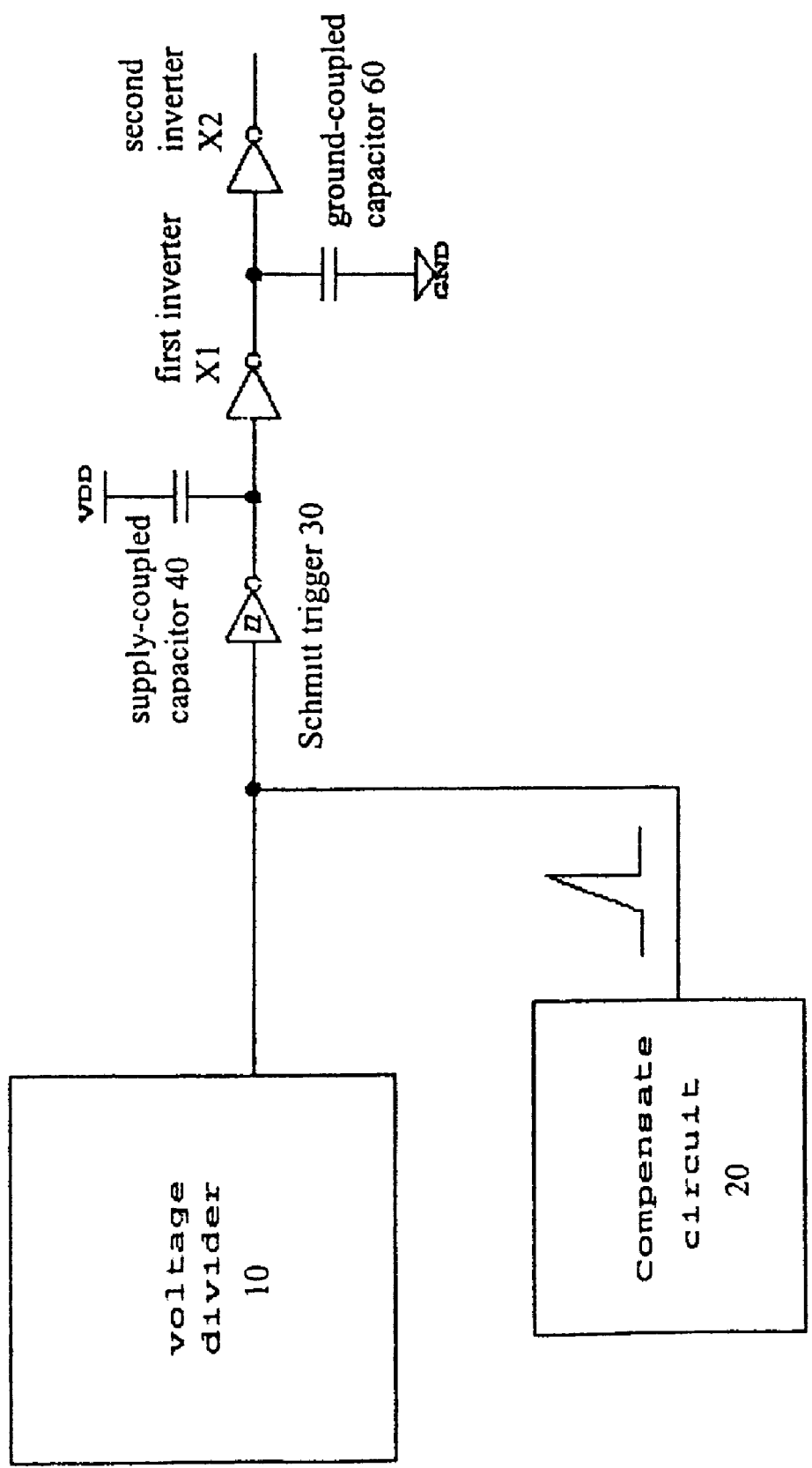
FIG. 1 is a conceptual schematic diagram of a power-on reset circuit, in accordance with an illustrated embodiment of the present invention.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of power supplies. The present invention may be practiced in conjunction with various integrated circuit fabrication techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to a power-on reset circuit with, for example, a supply signal and temperature immunity, ultra-low DC leakage current, and/or fast power crash reaction.

Unless otherwise indicated, the terms "voltage," "signal," "level," and "threshold" refer to voltages. For example, the term "supply signal VDD" should be regarded as a voltage provided to the power-on reset circuit. Comparisons between a voltage and a "threshold" should be regarded as comparisons between voltages. Also, the term "one threshold drop" is used repeatedly throughout this disclosure to refer to a voltage difference that is approximately equal to the threshold voltage of any of the transistors; ordinarily "one threshold drop" should refer to a voltage difference of approximately 0.6 volts, but should be understood to represent a different value if different transistors are used. It should be recalled that in the illustrated embodiment the threshold voltage of any transistor in the power-on reset circuit is substantially equal to the threshold voltage of all of the other transistors in the power-on reset circuit.

Although other embodiments are contemplated, in the illustrated embodiment only a single $V_t$ MOS is used and the Schmitt-trigger determines the power reset trigger level. The power-on/off voltage is defined by means of a reset signal. When the supply signal VDD is unstable, a low-end resistor R2 tracks VDD relatively closely on node LB. This differs from some known systems in which MOS devices with different $V_t$ are used for power-on reset. The power reset trigger level for such previously-known systems can be down to 1.2 volts due to the feedback PMOS for reduction of DC leakage current.

Figure 2:
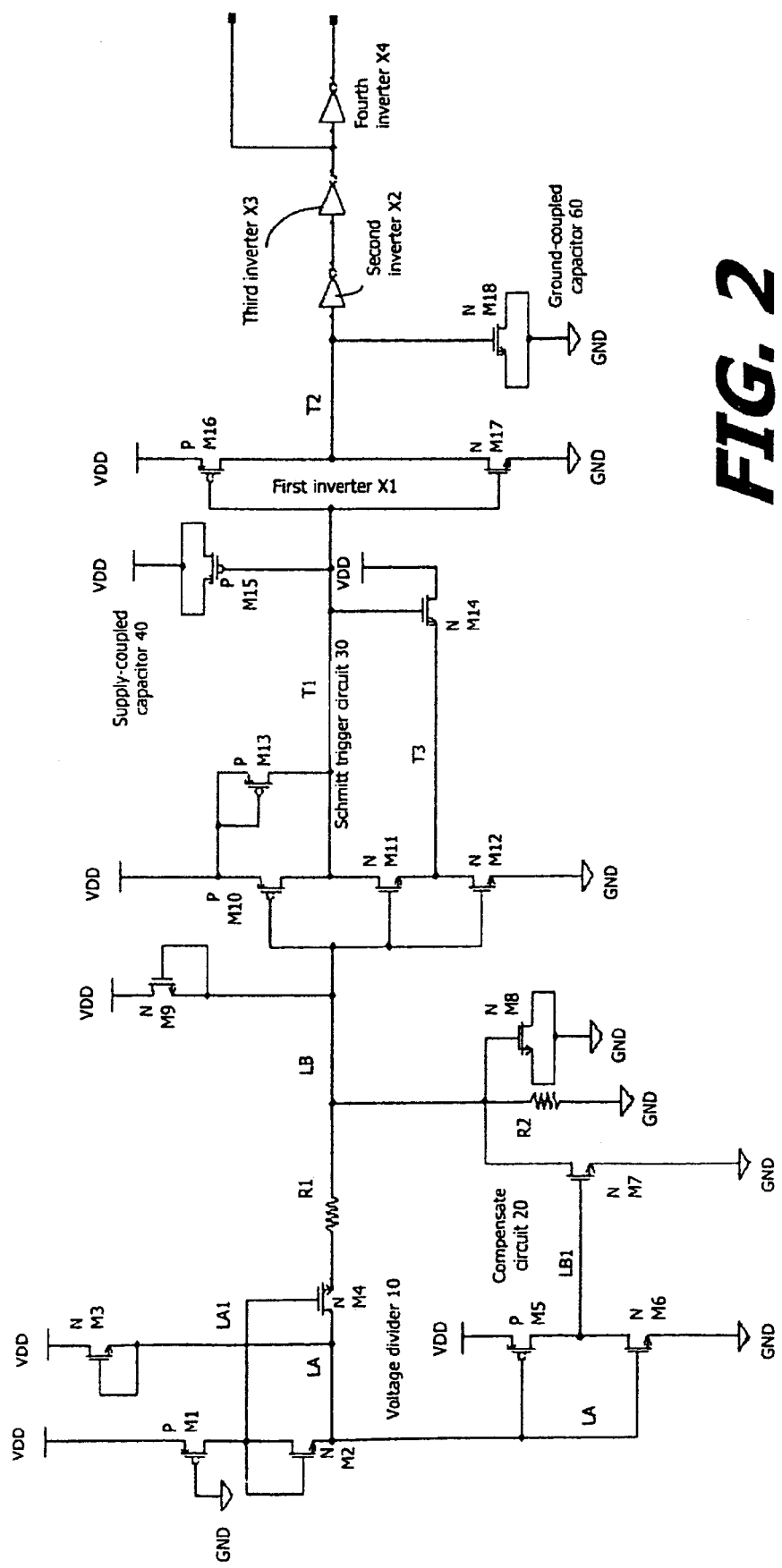
FIG. 2 is a detailed schematic diagram of a power-on reset circuit, in accordance with the illustrated embodiment of the present invention.

Referring more particularly to the drawings, FIG. 1 is a conceptual schematic diagram of a power-on reset circuit in accordance with an illustrated embodiment of the present invention. The power-on reset circuit is shown including a voltage divider 10, a compensate circuit 20, a Schmitt trigger circuit 30, a supply-coupled capacitor 40, a first inverter X1, a ground-coupled capacitor 60, and a second inverter X2. FIG. 2 is a detailed schematic diagram of a power-on reset circuit, in accordance with the illustrated embodiment of the present invention. The power-on reset circuit includes the voltage divider 10, the compensate circuit 20, the Schmitt trigger circuit 30, the supply-coupled capacitor 40, the first inverter X1, the ground-coupled capacitor 60, the second inverter X2, and a third inverter X3.

With continuing reference to both FIG. 1 and FIG. 2, a purpose of the voltage divider 10 is to present a constant voltage at the Schmitt trigger input node LB that tracks VDD whenever power is applied to the power-on reset circuit despite variances such as thermal variations. The voltage at the Schmitt trigger input node LB may be referred to as a trigger voltage, since it is a voltage that is provided as an input to the Schmitt trigger circuit. The voltage divider 10 includes a current source transistor M1, a diode transistor M2, a transistor M4, a high-end resistor R1, and a low-end resistor R2. A compensation transistor M7 and a snubber capacitor (implemented as a snubber transistor M8) are provided in parallel with the low-end resistor R2.

A gate-to-source voltage (equal to VDD) across the current source transistor M1 establishes a primary current through the current source transistor M1 and the diode transistor M2. Substantially all of the primary current flows through the transistor M4 (whose gate-to-drain voltage is equal to a gate-to-source voltage of the diode transistor M2). The primary current through the high-end resistor R1, and through the much larger low-end resistor R2, serves as a voltage divider 10 that maintains the Schmitt trigger input voltage at the Schmitt trigger input node LB.

A purpose of the compensate circuit 20 is to maintain the voltage of the Schmitt trigger input node LB at a substantially constant voltage, despite voltage transients, current transients, and/or thermal drift of the voltages and currents at other nodes of the voltage divider 10. The compensate circuit includes a CMOS inverter (including a PMOS compensation control transistor M5 and an NMOS compensation control transistor M6) and a compensation transistor M7. The gate terminals of the PMOS compensation control transistor M5 and the NMOS compensation control transistor M6 are connected to the node LA. The source terminals of the PMOS compensation control transistor M5 and of the NMOS compensation control transistor M6 are coupled to the supply signal VDD and the ground potential, respectively. The drain terminals of the PMOS compensation control transistor M5 and of the NMOS compensation control transistor M6 are both connected to the gate terminal of the compensation transistor M7, referred to as a compensation transistor gate terminal node LB1.

In addition to passing the primary current from the current source transistor M1 to the transistor M4, the diode transistor M2 also produces a voltage at the node LA that becomes more positive as the primary current increases. In other words, taking the current source transistor M1 and the transistor M4 as resistor-like elements and the diode transistor M2 as a diode, increases in current through the current source transistor M1 result in increases in the voltage of the node LA1. Moreover, such increases in current result in increases in the voltage at the source of the diode transistor M2 (i.e., node LA). Since transistor M4 is a resistor-like element as is transistor M1, the voltage value of the Schmitt trigger input node LB also increases. Thus, the voltage of nodes LA, LA1, and LB are all in proportion to the current passing through M1 and the supply voltage.

If the primary current increases, for example, due to thermal variations in the voltage-current relationship of the current source transistor M1 (e.g., a temperature increase), the voltage at the node LA increases. Consequently, the CMOS inverter (i.e., the PMOS compensation control transistor M5 and the NMOS compensation control transistor M6) provides a compensation control voltage that decreases to the gate terminal of the compensation transistor M7. Any increase in feedback current, which would otherwise flow through the compensation transistor M7 as a result of the temperature increase, is quenched. The compensation transistor M7 is preferably matched to maintain a relatively constant current through the low-end resistor R2, and consequently the Schmitt trigger input voltage at the Schmitt trigger input node LB remains substantially constant. A small leakage current through the voltage divider 10, and through the clamping transistor M3 (which behaves as a small current source), keeps the voltage at the node LA from drifting too far below the supply signal VDD. On the other hand, any decrease in the primary current through the current source transistor M1 as a result of, for example, a temperature drop, would decrease the voltage at the node LA. Consequently, the voltage at the gate of the compensation transistor M7 is increased, facilitating a flow of current through the compensation transistor M7 that would otherwise be diverted through R2 due to, for example, the temperature decrease. Once again, in the illustrated embodiment the current through the low-end resistor R2 remains substantially constant, despite fluctuations of the primary current.

Figure 3:
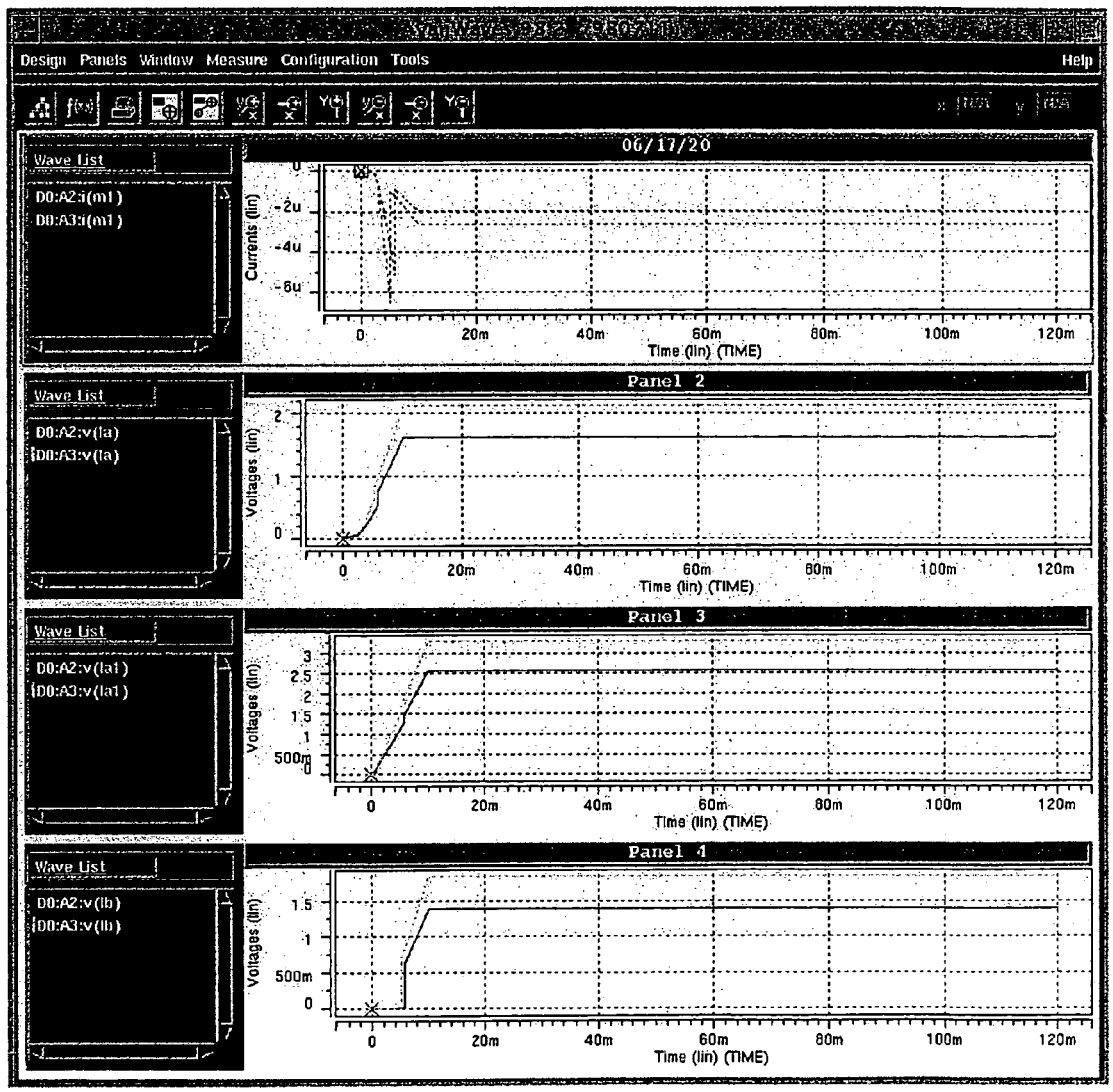
FIG. 3 is a set of graphs depicting simulated responses versus time of a current source transistor M1 (m1), a node LA (la), a node LA1 (la1), and a Schmitt trigger input node LB (lb) in accordance with an illustrated embodiment of the present invention.
Figure 4:
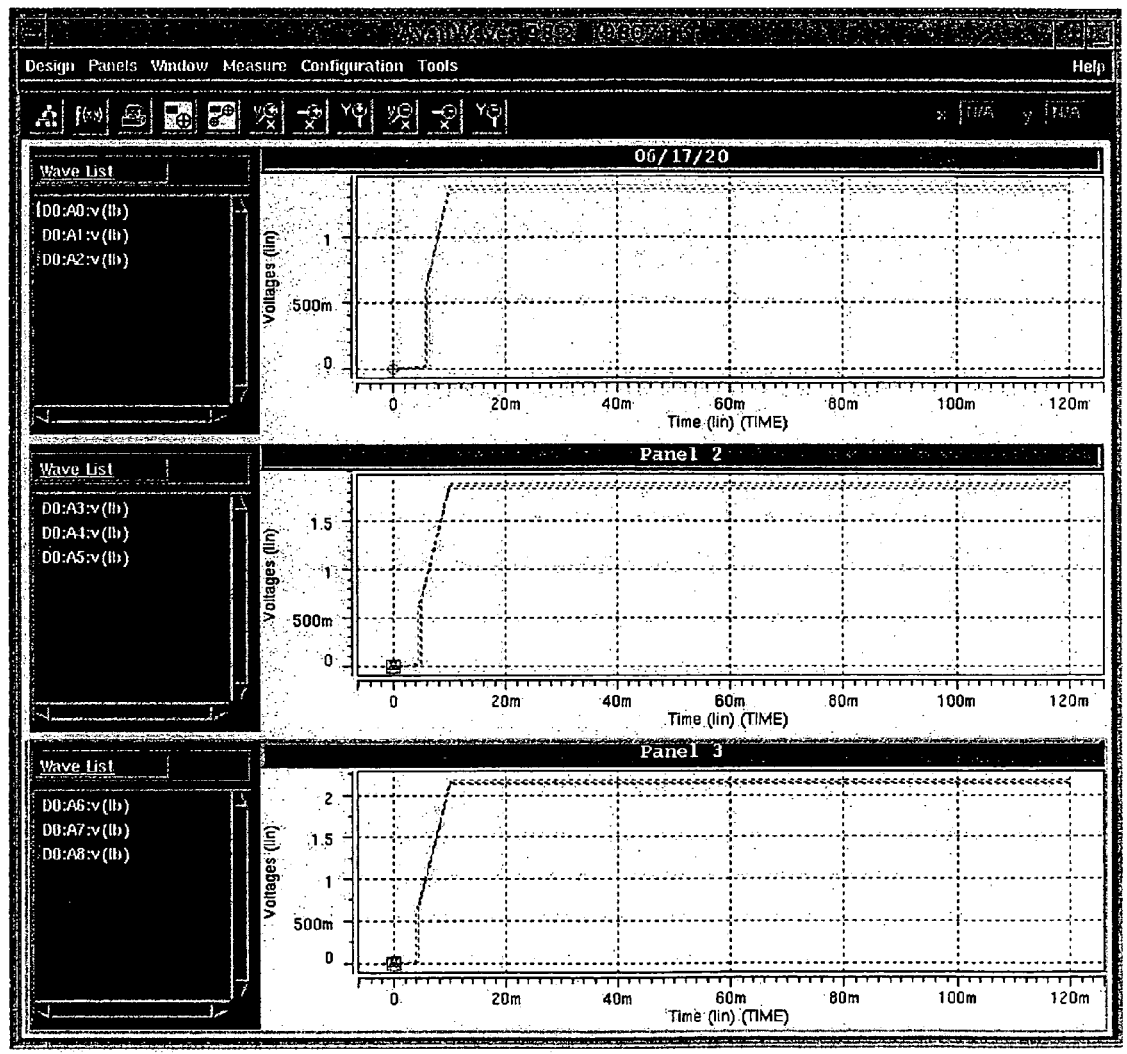
FIG. 4 is a set of graphs depicting simulated responses of the node LB for various temperatures and supply voltages, in accordance with an illustrated embodiment of the present invention.

FIG. 3 is a set of graphs depicting simulated responses versus time of the current source transistor M1, the node LA, the node LA1, and the Schmitt trigger input node LB in accordance with an illustrated embodiment of the present invention. FIG. 4 a set of graphs depicting simulated responses of the Schmitt trigger input node LB for various temperatures and supply voltages, in accordance with the illustrated embodiment of the present invention. Regarding FIG. 4, in the first panel voltages of the Schmitt trigger input node LB versus time are plotted for a supply signal VDD powering up to 2.7 volts at a temperature of −25 C., at a temperature of 25 C., and at a temperature of 85 C., wherein the three plots essentially overlap one another. In the second panel voltages of the Schmitt trigger input node LB versus time are plotted for a supply signal VDD powering up to 3.3 volts at temperatures of −25 C., 25 C., and 85 C., wherein the three plots essentially overlap one another, and in the third panel voltages of the Schmitt trigger input node LB versus time are plotted for a supply signal VDD powering up to 3.7 volts at temperatures of −25 C., 25 C., and 85 C., wherein the three plots essentially overlap one another.

The snubber transistor M8 is configured as a capacitor, smoothing any transient fluctuations in the voltage at the Schmitt trigger input node LB.

A purpose of the Schmitt trigger circuit is to provide a power-on reset signal. If the voltage of the supply signal VDD increases from ground potential (or from a near-zero voltage such as 1 volt), then the power-on reset signal is to have a voltage that increases with the voltage of supply signal VDD and then falls abruptly when the supply signal VDD exceeds a threshold voltage. (By rising and then falling abruptly, the Schmitt trigger circuit can cause the inverters at the output of the Schmitt trigger circuit to generate the power-on reset signal.) If the voltage of the supply signal increases from any voltage that is significantly higher than ground potential, however, (for example upon recovering from a sleep state) then the power-on reset signal is to have a voltage that remains approximately zero (i.e., at ground potential). Moreover, a power-on reset signal of reduced amplitude is generated in response to a decrease in the supply signal from the operational voltage to a zero or near-zero voltage (associated with a power-down state), and a power-on reset signal of greater amplitude is generated in response to an increase in the supply signal from a zero or near-zero voltage (associated with a power-down state) to the operational voltage.

To understand the operation of the Schmitt trigger, it may be helpful to regard the transistors as operating as variable resistors, in which the "resistance" between the source and drain terminals of each transistor is controlled by the gate voltage; as the gate voltage of an NMOS transistor increases, the "resistance" between the source and drain terminals of the NMOS transistor decreases, and as the gate voltage of a PMOS transistor increases, the "resistance" between the source and drain terminals of the NMOS transistor increases.

The Schmitt trigger circuit includes a PMOS initialization transistor M10, an NMOS Schmitt trigger transistor M11, a disable transistor M12, an RC transistor M13, and a feedback transistor M14. The PMOS initialization transistor M10 is configured with a gate terminal coupled to the Schmitt trigger input node LB, a source terminal coupled to the supply signal VDD, and a drain terminal coupled to a reset signal node T1. The NMOS Schmitt trigger transistor M11 is configured with a gate terminal coupled to the Schmitt trigger input node LB, a drain terminal coupled to the reset signal node T1, and a source terminal coupled to a threshold-enhancement node T3. The disable transistor M12 is configured with a gate terminal coupled to the Schmitt trigger input node LB, a drain terminal coupled to the threshold-enhancement node T3, and a source terminal coupled to a ground potential. The feedback transistor M14 is configured with a gate terminal coupled to the reset signal node T1, a source terminal coupled to the threshold-enhancement node T3, and a drain terminal coupled to the supply signal VDD.

The Schmitt trigger circuit achieves the purposes of the power-on reset circuit by responding to variations in the supply signal VDD as seen at the source terminal of the PMOS initialization transistor M10. It will be recalled that the voltage divider 10 and the clamping transistor M9 maintain a relatively small voltage difference between the gate terminal and the source terminal of the PMOS initialization transistor M10, and maintain a relatively large voltage difference between the gate terminal of the PMOS initialization transistor M10 and the various source terminals of the NMOS Schmitt trigger transistor M11 and the disable transistor M12. The voltage applied to the Schmitt trigger input node LB during normal operation, e.g., when the supply signal VDD is at its operational voltage, is therefore large enough to enable conduction of the NMOS Schmitt trigger transistor M11 and the disable transistor M12.

Specifically, during normal operation when the supply signal VDD is at its operational voltage the voltage at the Schmitt trigger input node allows far more current to pass through the NMOS Schmitt trigger transistor M11 and the disable transistor M12 than through the PMOS initialization transistor M10. The high voltage at the Schmitt trigger input node LB creates a very high impedance through the PMOS initialization transistor M10, while creating a very low impedance through the NMOS Schmitt trigger transistor M11 and disable transistor M12. Accordingly, during normal operation, both the reset signal node T1 and the threshold-enhancement node T3 discharge any residual charge through the NMOS Schmitt trigger transistor M11 and the disable transistor M12.

Figure 5:
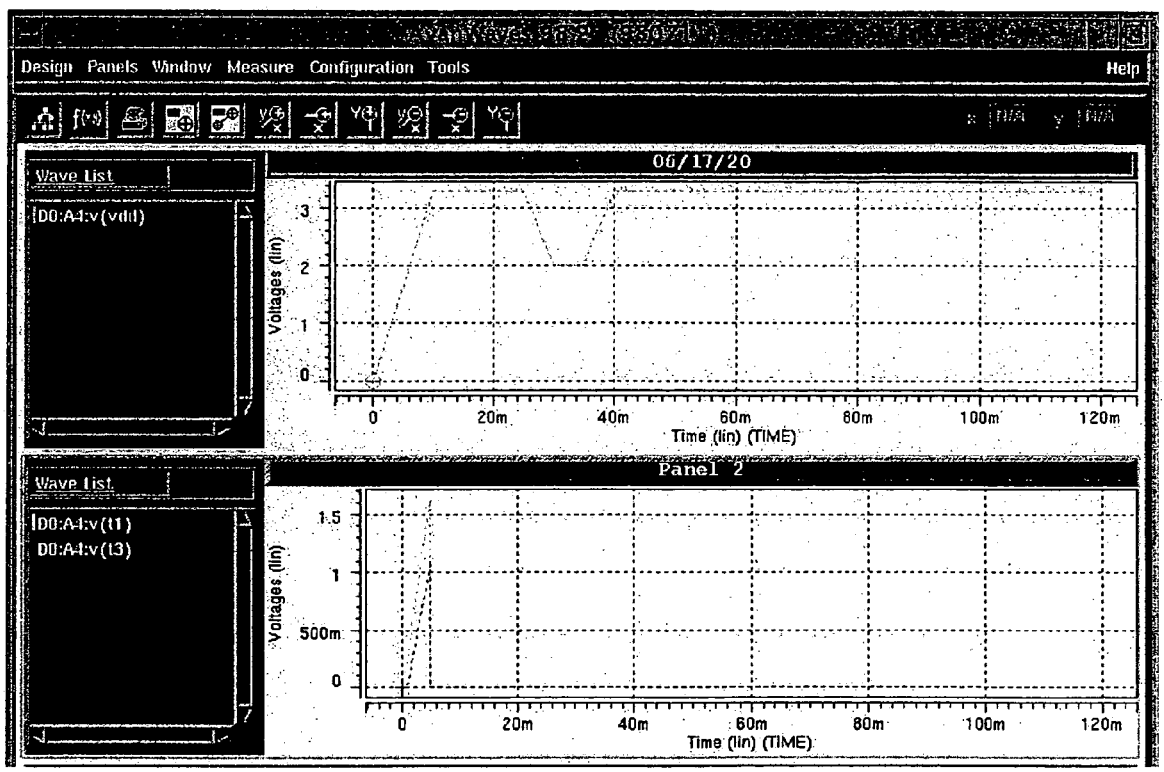
FIG. 5 is a set of graphs depicting simulated responses for the reset signal node T1 (t1) and a threshold-enhancement node T3 (t3) for various levels of the supply signal VDD (vdd), in accordance with an illustrated embodiment of the present invention.

FIG. 5 a set of graphs depicting simulated responses for the reset signal node T1 (t1) and the threshold-enhancement node T3 (t3) for various levels of the supply signal VDD (vdd). In particular, the top panel is a plot of the supply signal VDD versus time; and the bottom panel is a plot of the reset signal node T1, shown with a solid line, and the threshold-enhancement node T3, shown with a dashed line, versus time for the supply signal VDD of the first panel. In the illustrated simulation, when the supply signal VDD is at its operational voltage, which in the simulation is about 3.3 volts, the values of the reset signal node T1 and the threshold-enhancement node T3 are zero.

Figure 6:
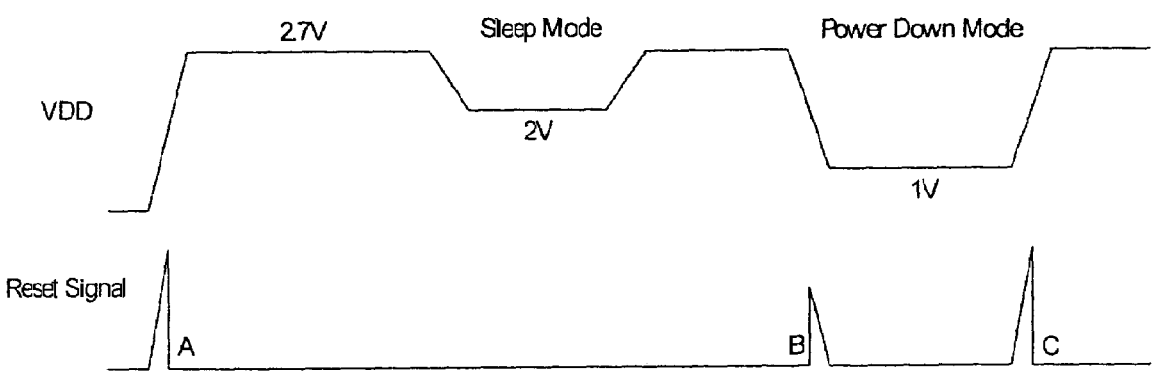
FIG. 6 is a set of plots depicting responses for the reset signal, measured at an output of a fourth inverter X4, which signal corresponds to that at the reset signal node T1, for various levels of the supply signal VDD, as the supply signal VDD transitions through an initial power-up, a sleep-mode, a power-down, and subsequent power-up in accordance with an illustrated embodiment of the present invention.

FIG. 6 a set of graphs depicting illustrative responses for the reset pulse (corresponding to the reset signal node T1) for various levels of the supply signal VDD, as the supply signal VDD transitions through an initial power-up, a sleep-mode, a power-down, and subsequent power-up. Preceding the initial power-up, the supply signal VDD is at an initial level of about 0 volts. At this low level, the Schmitt trigger input node LB is low enough (e.g., 0 volts) to allow the PMOS initialization transistor M10 to conduct so that the reset signal node T1 tracks the supply signal VDD. Also, the Schmitt trigger transistor M1 and the disable transistor M12 are off, and the threshold-enhancement node T3 is low. As the supply signal VDD rises, the reset signal node T1 continues to be charged by current from the PMOS initialization transistor M1, until the potential of the reset signal node T1 is great enough to turn on the feedback transistor M14 at which time the threshold-enhancement node T3 is charged via current from the supply signal VDD passing through the feedback transistor M14. Upon being charged, the threshold-enhancement node T3 raises the threshold voltage of the NMOS Schmitt trigger transistor M11 so that the Schmitt trigger input node LB cannot turn on the Schmitt trigger as easily, which phenomena is reflected in a larger pulse A (wherein the threshold-enhancement node T3 is charged) relative the smaller pulse B (wherein the threshold-enhancement node T3 is not charged). As the supply signal VDD continues to rise, the potential of the Schmitt trigger input node LB will become great enough to turn off the PMOS initialization transistor M10 and to turn on both the Schmitt trigger transistor M11 and the disable transistor M12 enough to drain the charges from the reset signal node T1 and the threshold-enhancement node T3.

Once the supply signal VDD reaches its operational voltage of about 2.7 volts in the illustration, the Schmitt trigger input node LB will be at a potential of, for example, about 1.5 volts, which is too great to open M10 enough to charge the reset signal node T3 high and which opens the Schmitt trigger transistor M11 and the disable transistor M12 enough to drain the charges from the reset signal node T1 and the threshold-enhancement node T3. Since the threshold-enhancement node T3 is not charged, the threshold voltage of the Schmitt trigger transistor M11 is not elevated which is reflected in the relatively small pulse B, described below.

With continuing reference to FIG. 6, sleep mode is defined as occurring when the supply signal VDD is brought to a lower voltage, but is not brought completely to a power-down potential. For example, during sleep mode the voltage of the supply signal VDD may be brought to about 2 volts with respect to ground potential. Throughout the sleep mode, the potential of the Schmitt trigger input node LB does not go low enough to allow the PMOS initialization transistor M10 to charge the reset signal node T1. Moreover, as a result of the relatively high potential of the Schmitt trigger input node LB, both the Schmitt trigger transistor M11 and the disable transistor M12 remain on so that any current from the PMOS initialization transistor M10 passes through the Schmitt trigger transistor M11 and the disable transistor M12 to ground without charging the reset signal node T1.

A power-down operation follows the sleep mode in which the supply signal VDD transitions from its operational voltage to a near-zero voltage which in the illustrated example is 1 volt. Just before the power-down, the supply signal VDD has a potential of 2.7 volts and the Schmitt trigger input node LB has a potential of about 1.5 volts which is too great to open M10 enough to charge the reset signal node T3 high and which opens the Schmitt trigger transistor M11 and the disable transistor M12 enough to drain any charges from the reset signal node T1 and the threshold-enhancement node T3. Since the threshold-enhancement node T3 is not charged, the threshold voltage of the Schmitt trigger transistor M11 is not elevated which is reflected in the relatively small pulse B. As the potentials of the supply signal VDD and the Schmitt trigger input node LB drop, the PMOS initialization transistor M10 will pass current through the Schmitt trigger transistor M11 and the disable transistor M12 but this current will not be sufficient to charge the reset signal node T1 high. The Schmitt trigger transistor M11 and the disable transistor M12 will then begin to shut off; and the PMOS initialization transistor M10 will conduct more current, which will begin to charge the reset signal node T1 high while also passing to a diminishing degree through the Schmitt trigger transistor M11 and the disable transistor M12. The reset signal node T1 will reach a potential high enough to turn on the feedback transistor M14 to thereby activate charging of the threshold-enhancement node T3. Upon being charged, the threshold-enhancement node T3 raises the threshold voltage of the NMOS Schmitt trigger transistor M11 so that the Schmitt trigger input node LB cannot turn on the Schmitt trigger as easily, which phenomena is reflected in the following larger pulse C.

During the power-down mode, the supply signal VDD remains at a potential of 1 volt and the Schmitt trigger input node LB remains low enough (e.g., about 0.2 volts) to allow the PMOS initialization transistor M10 to conduct so that the reset signal node T1 tracks the supply signal VDD. Also, the Schmitt trigger transistor M11 and the disable transistor M12 are off, and the threshold-enhancement node T3 remains charged. Upon exiting the power down mode, as the supply signal VDD begins to rise, the potential of the Schmitt trigger input node LB becomes great enough to turn off the PMOS initialization transistor M10 and to turn on the Schmitt trigger transistor M11 and the disable transistor M12 enough to drain the charges from the reset signal node T1 and the threshold-enhancement node T3.

With reference back to FIG. 3, leakage current through the low-end resistor R2 may be limited by the use of a very large resistor for the low-end resistor R2. Since the power dissipation (manifested as heat and loss of battery life) of the low-end resistor R2 is approximately $V^2/R$, where V is the voltage at the Schmitt trigger input node LB and R is the resistance of the low-end resistor R2, a high resistance for the low-end resistor R2 can limit the deleterious effects of leakage current. Since the voltage at the Schmitt trigger input node LB is approximately IR, where I is the current through the low-end resistor R2 and R is the resistance of the low-end resistor R2, a suitably high resistance of the low-end resistor R2 allows the voltage at the Schmitt trigger input node LB to be maintained with a low primary current. The standby current is smaller than 10 uA under 2.6 to 3.8 volts, and −40 to 100 degrees C., and all process corners. The reset signal level is accurately under 2.6 to 3.8 volts and −40 to 100 degrees C.

Four digital inverters in series receive the voltage of the reset signal node T1. In the first inverter, the voltage of the reset signal node T1 is applied to the gate terminals of the PMOS output driver transistor M16 and the NMOS output driver transistor M17. As the voltage of the reset signal node T1 increases, the voltage at the output node T2 decreases; as the voltage of the reset signal node T1 decreases, the voltage at the output node T2 increases.

The reset signal node T1 is also coupled across a supply-coupling transistor M15, which is configured as a capacitor, and the output node T2 is coupled across the ground-coupling transistor M18, which is also configured as a capacitor. The second inverter X2, the third inverter X3, and the fourth inverter X4 provide current buffering for the output.

Figure 7A:
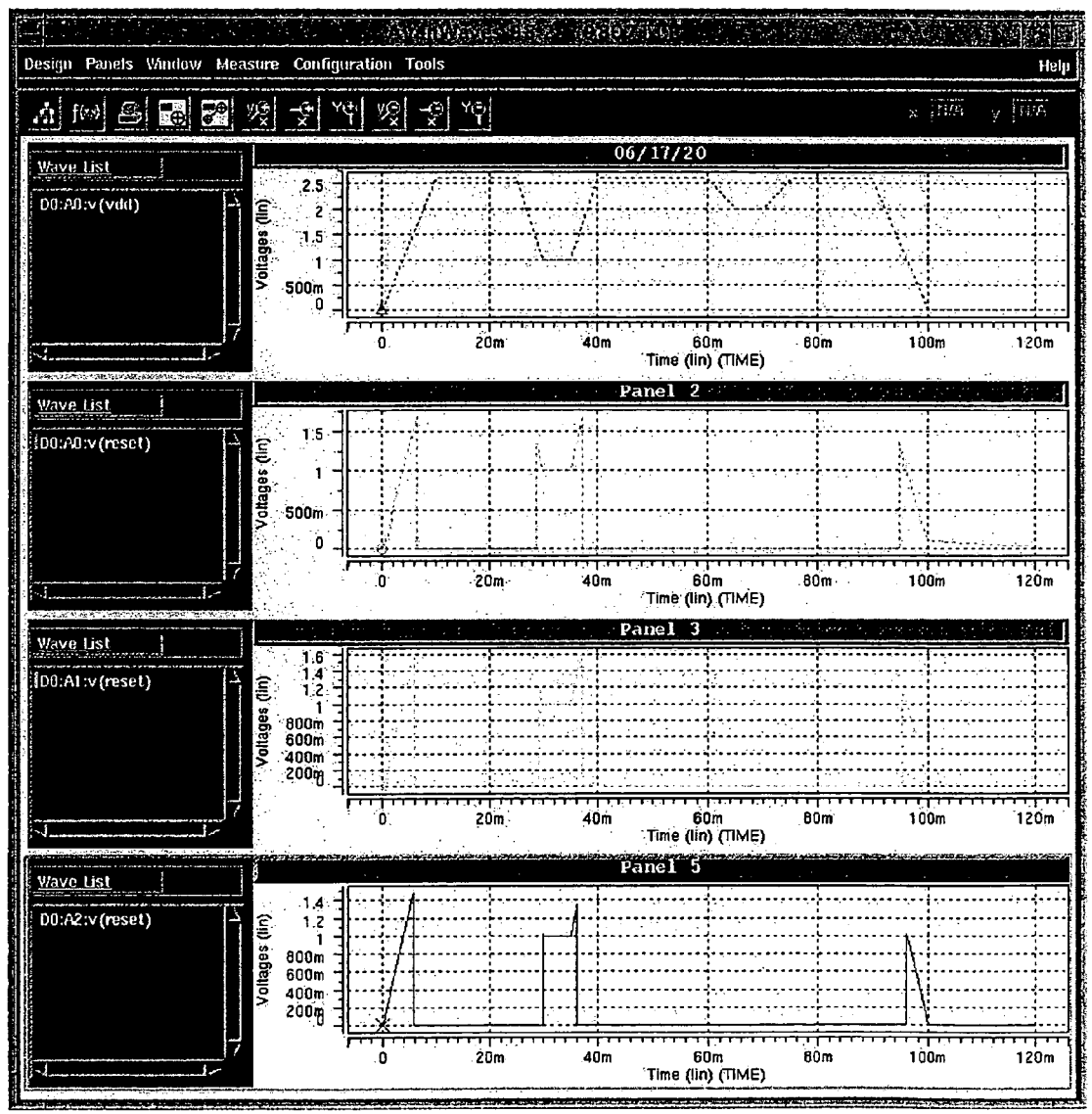
FIG. 7A is a set of graphs depicting simulated responses versus time of the reset signal for a 2.7 volt supply signal VDD at various temperatures in accordance with an illustrated embodiment of the present invention.

FIG. 7A is a set of graphs depicting simulated responses versus time of the reset signal which is measured at the output of the fourth inverter X4, which signal corresponds to the reset signal node T1, in accordance with an illustrated embodiment of the present invention. In the first panel a voltage waveform of the supply signal VDD at 2.7 volts versus time is elucidated, and the second panel provides a plot of the reset signal versus time for the supply signal VDD of the first panel at a temperature of −25 C. The third panel is a plot of the reset signal versus time for the supply signal VDD of the first panel at a temperature of 25 C., and the fourth panel is a plot of the reset signal versus time for the supply signal VDD of the first panel at a temperature of 85 C.

Figure 7B:
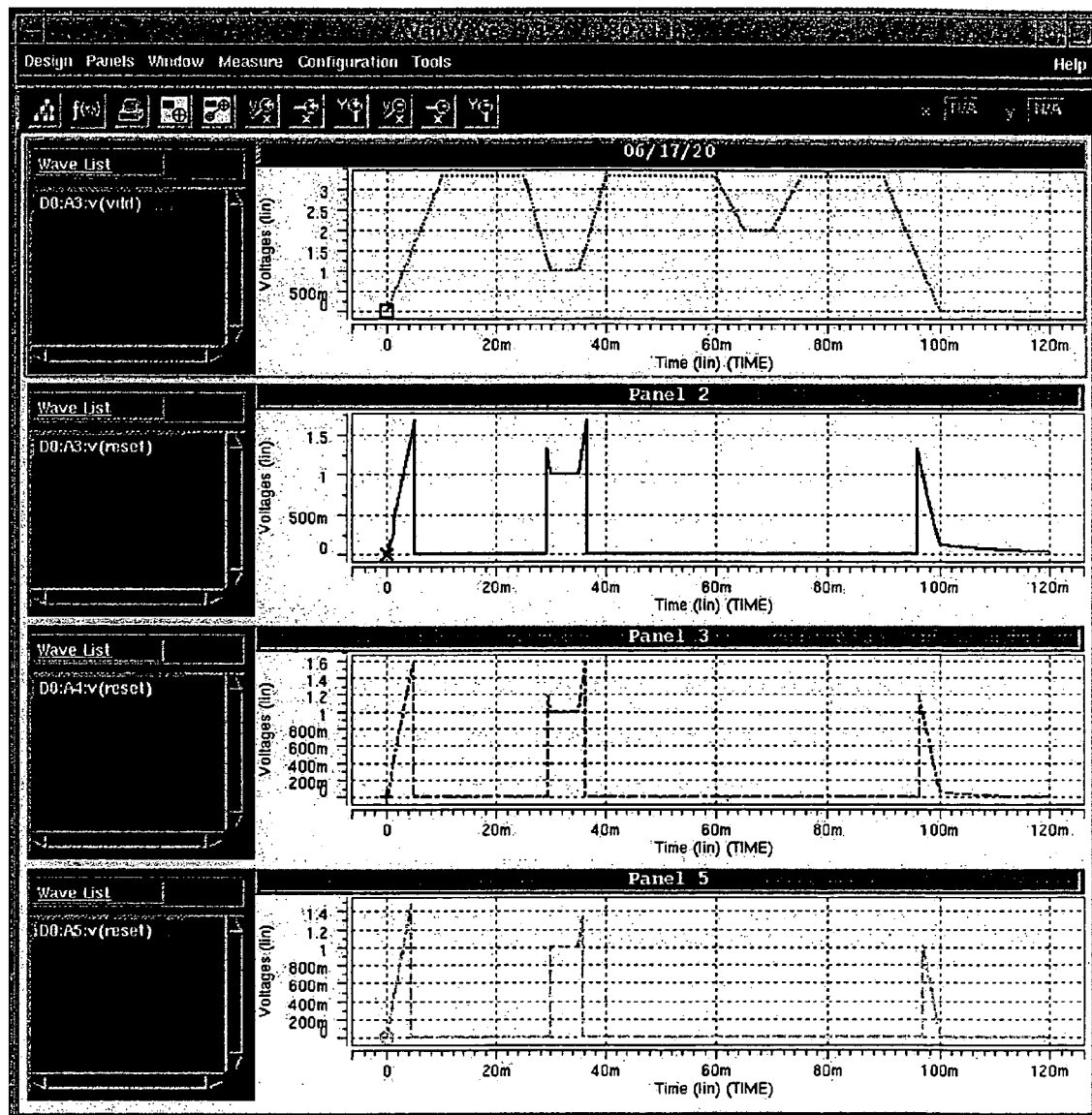
FIG. 7B is a set of graphs depicting simulated responses versus time of the reset signal for a 3.3 volt supply signal VDD at various temperatures in accordance with an illustrated embodiment of the present invention.

FIG. 7B is a set of graphs depicting simulated responses versus time of the reset signal at output of the fourth inverter X4 in accordance with an illustrated embodiment of the present invention. In the first panel a voltage waveform of the supply signal VDD at 3.3 volts versus time is provided, and in the second panel a plot of the reset signal versus time for the supply signal VDD of the first panel and at a temperature of −25 C. is provided. The third panel is a plot of the reset signal versus time for the supply signal VDD of the first panel and at a temperature of 25 C., and the fourth panel is a plot of the reset signal versus time for the supply signal VDD of the first panel and at a temperature of 85 C.

Figure 7C:
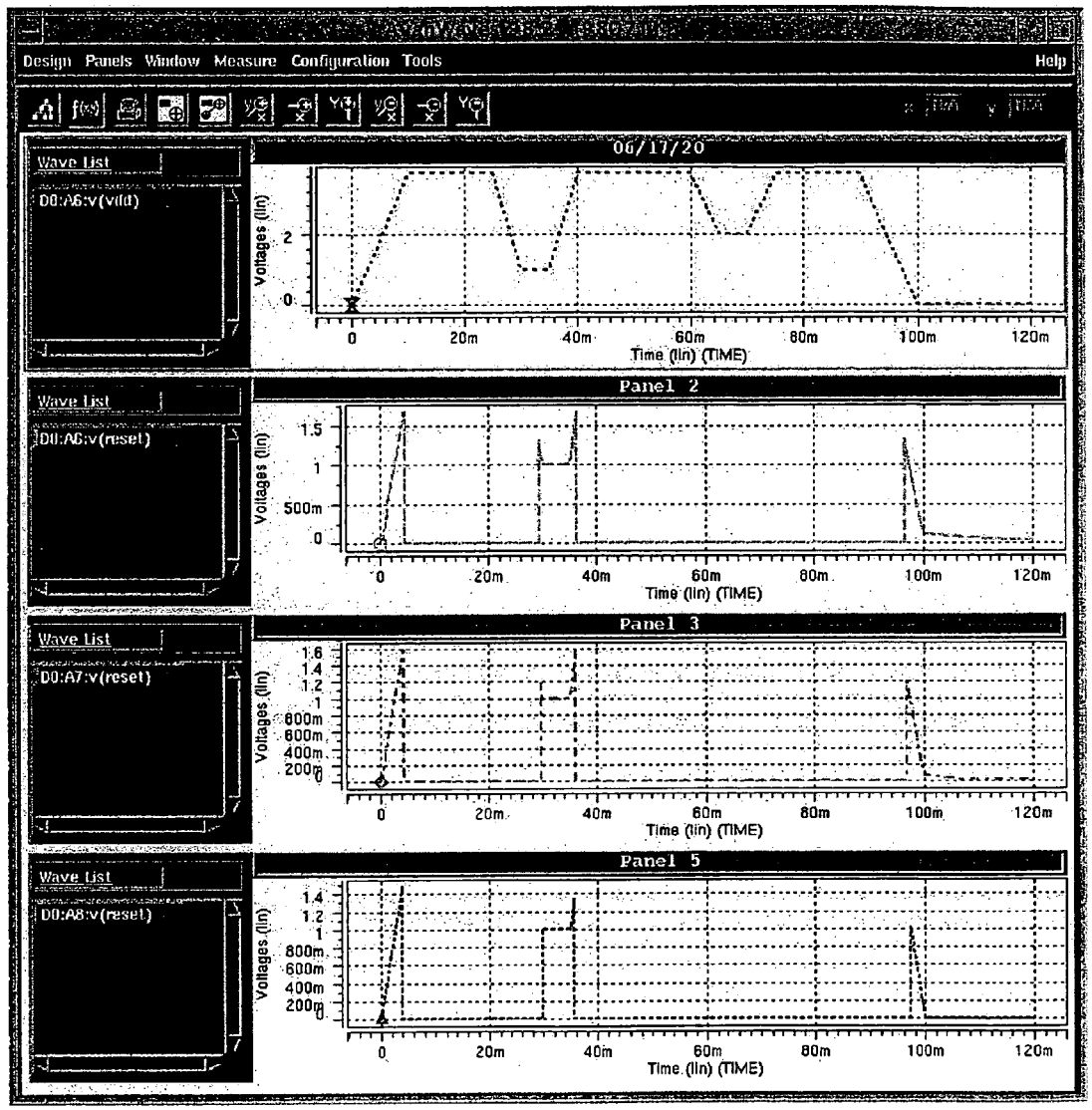
FIG. 7C is a set of graphs depicting simulated responses versus time of the reset signal for a 3.7 volt supply signal VDD at various temperatures in accordance with an illustrated embodiment of the present invention.

FIG. 7C is a set of graphs depicting simulated responses versus time of the reset signal at output of the fourth inverter X4 in accordance with an illustrated embodiment of the present invention. In the first panel a voltage waveform of the supply signal VDD at 3.7 volts versus time is provided, and the second panel provides a plot of the reset signal versus time for the supply signal VDD of the first panel and at a temperature of −25 C. The third panel is a plot of the reset signal versus time for the supply signal VDD of the first panel and at a temperature of 25 C., and the fourth panel is a plot of the reset signal versus time for the supply signal VDD of the first panel and at a temperature of 85 C.

Figure 8A:
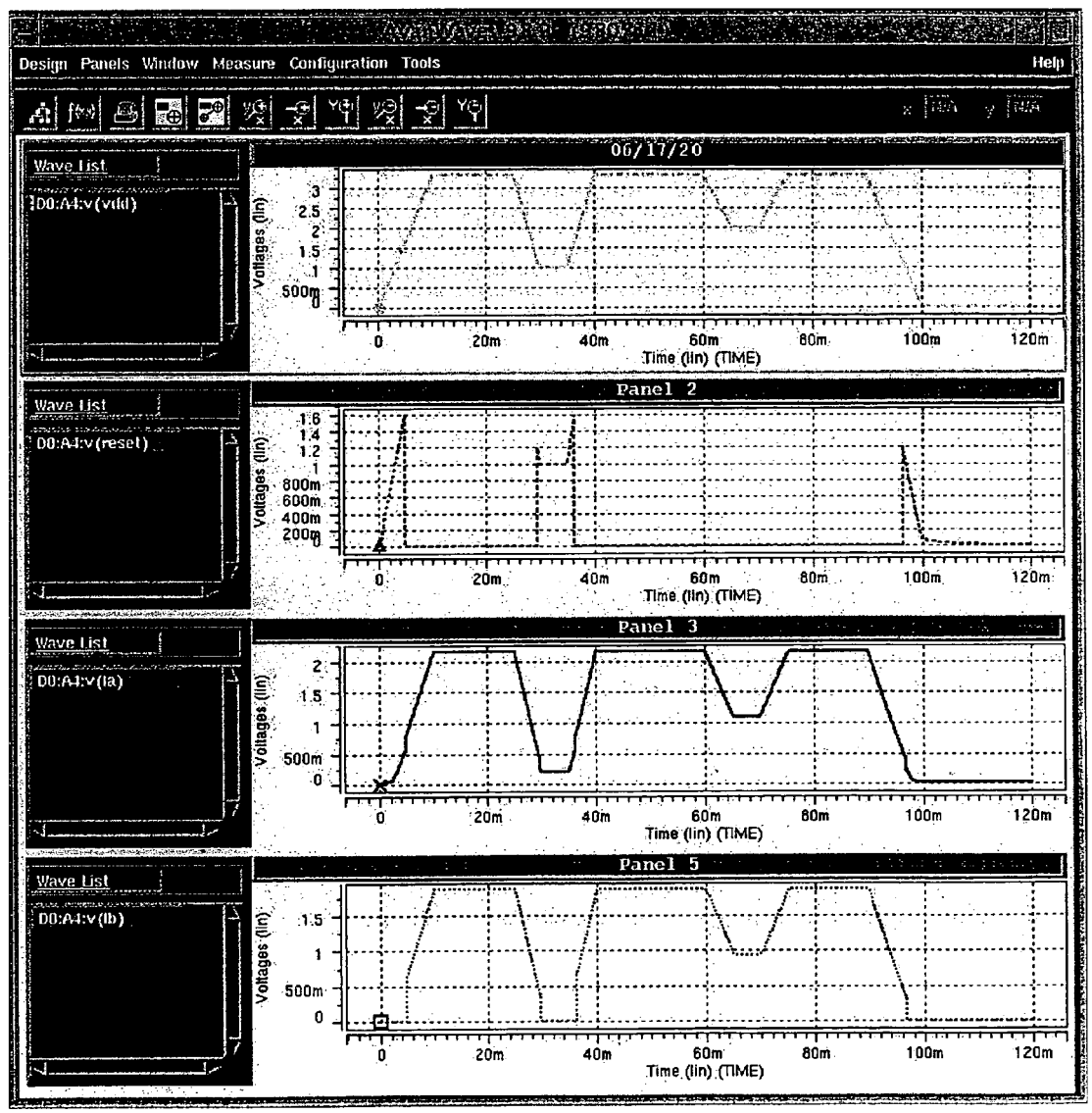
FIG. 8A is a set of graphs depicting simulated responses versus time of the supply signal VDD, the reset signal node T1, the node LA, and the Schmitt trigger input node LB, in accordance with an illustrated embodiment of the present invention.

FIG. 8A is a set of graphs depicting simulated responses versus time of various signals in accordance with an illustrated embodiment of the present invention. In the first panel a voltage waveform of the supply signal VDD at 3.3 volts versus time is provided, and the second panel provides a plot of the reset signal at the output of the fourth inverter X4 versus time for the supply signal VDD of the first panel. The third panel is a plot of the potential of the node LA versus time for the supply signal VDD of the first panel, and the fourth panel is a plot of the potential of the Schmitt trigger input node LB versus time for the supply signal VDD of the first panel.

Figure 8B:
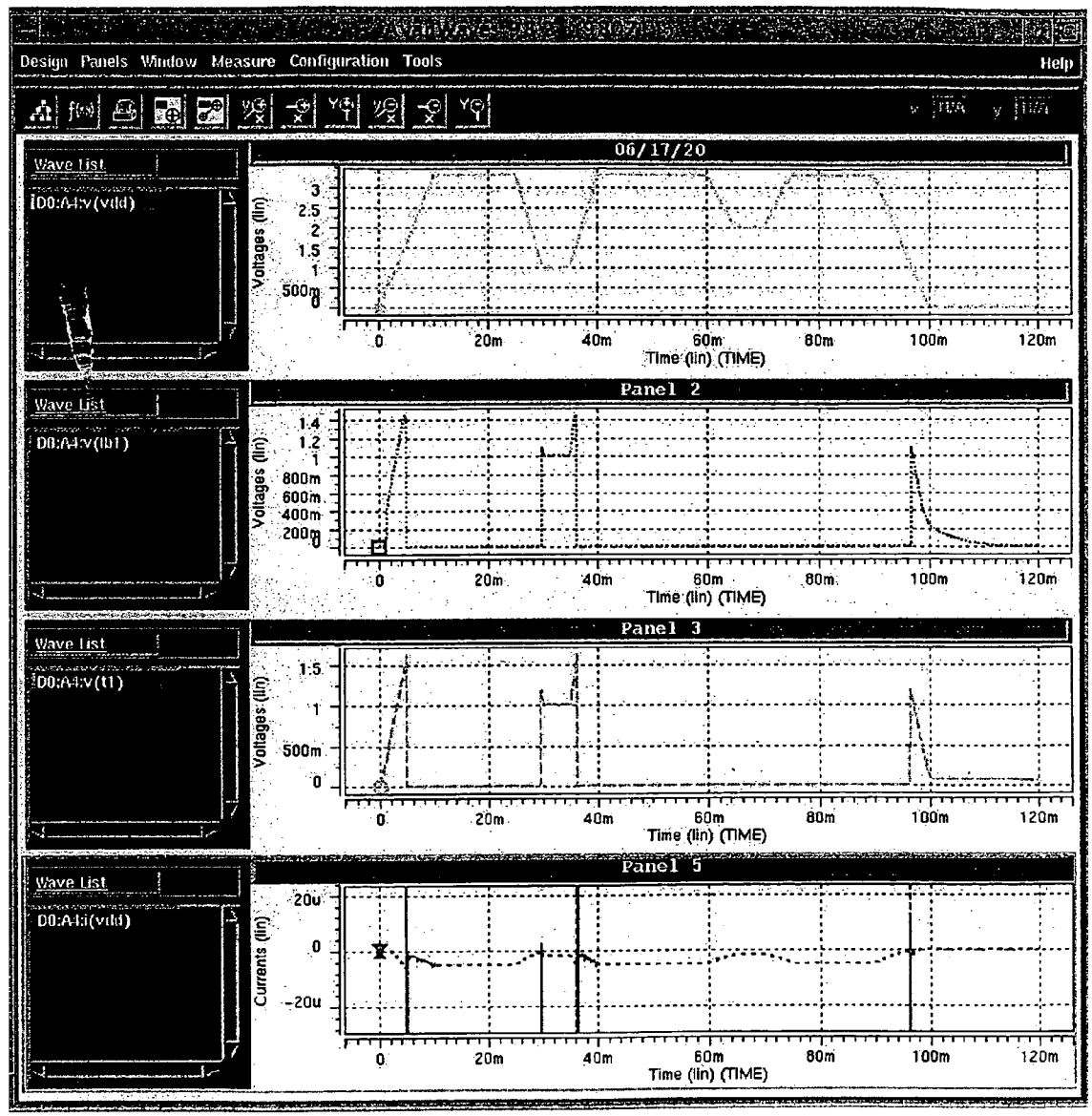
FIG. 8B is a set of graphs depicting simulated responses versus time of the supply signal VDD, the compensation transistor gate terminal node LB1 (lb1), the reset signal node T1, and the standby current of the whole circuit, in accordance with an illustrated embodiment of the present invention.

FIG. 8B is a set of graphs depicting simulated responses versus time of additional signals in accordance with an illustrated embodiment of the present invention. In the first panel a voltage waveform of the supply signal VDD at 3.3 volts versus time is provided, and the second panel provides a plot of the potential of the compensation transistor gate terminal node LB1 versus time for the supply signal VDD of the first panel. The third panel is a plot of the potential of the reset signal node T1 versus time for the supply signal VDD of the first panel, and the fourth panel is a plot of the standby current of the whole circuit versus time for the supply signal VDD of the first panel.

The circuit in accordance with the embodiment of the present invention illustrated in FIG. 2 may reside within a computer system. The computer system includes a memory for storing instructions and data, a bus coupled to the memory, and a microprocessor (or multiple microprocessors) for responding to control signals and for processing the data in accordance with the instructions. The computer system includes the power-on reset circuit that generates a power-on reset signal to the microprocessor. The power-on reset circuit comprises a Schmitt trigger circuit constructed with a plurality of MOS devices of one $V_t$ for determining a power reset trigger level. The power reset trigger level is determined by the voltage at the threshold-enhancement node T3.

The power reset trigger level includes a voltage divider connected to an input of the Schmitt-trigger circuit for tracking supply signal VDD. The voltage divider includes a current source transistor, such as the current source transistor M1, operative to generate a current in response to a supply signal such as supply signal VDD (observed at the source terminal of the current source transistor M1). The voltage divider includes a large low-side resistor, specifically the low-side resistor R2, whose large resistance provides for reduction of leakage current.

The power-on reset circuit further includes a compensate circuit for generating a small reset pulse to compensate for temperature and the supply signal variation effect. The small reset pulse is, for example, the current through the compensation transistor M7. The compensate circuit adjusts a feedback current to restore a voltage at the input of the Schmitt-trigger circuit, in response to a fluctuation in for example temperature. The feedback current is, for example, the current through the compensation transistor M7.

The Schmitt trigger circuit includes a reset signal node, corresponding to the power-on reset signal. The Schmitt trigger circuit compares the voltage of the Schmitt trigger input node LB (which relates to the voltage of the supply signal) to a first threshold voltage, determined by the threshold-enhancement node T3. The reset signal node has a voltage that rises from a ground potential to a first voltage when the supply signal rises if the supply signal is less than the first threshold voltage. The voltage of the reset signal node drops from the first voltage to the ground potential when the supply signal has not compared favorably to the first threshold voltage, if the Schmitt trigger circuit has entered a sleep mode. The reset signal node is substantially unresponsive to variations of the supply signal if the Schmitt trigger circuit has not entered a sleep mode.

In view of the foregoing, it will be understood by those skilled in the art that the methods of the present invention can facilitate formation of power supply circuitry and, more particularly, to power-on resets for power supply circuitry.

The above-described embodiments have been provided by way of example, and the present invention is not limited to these examples. Multiple variations and modifications to the disclosed embodiments will occur, to the extent not mutually exclusive, to those skilled in the art upon consideration of the foregoing description. For example, modified embodiments can include one or more of various/different types of compensation circuits, voltage dividers, and Schmitt trigger circuits. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A power-on reset circuit, comprising:
   a Schmitt trigger circuit comprising a plurality of MOS devices and a threshold-enhancement node, each of said devices having the same $V_t$ for determining a power reset trigger level, the threshold-enhancement node having a first voltage when the Schmitt trigger circuit is in a power-down mode and having a second voltage when the Schmitt trigger circuit is in a sleep mode; and
   a voltage divider connected to an input of the Schmitt-trigger circuit and configured to track a supply signal.

2. The power-on reset circuit according to claim 1, and further comprising a compensate circuit operatively coupled to the Schmitt trigger circuit for generating a reset pulse to compensate for temperature and a supply signal variation effect.

3. The power-on reset circuit according to claim 1, wherein the voltage divider includes a current source transistor operative to generate a current in response to the supply signal.

4. The power-on reset circuit according to claim 1, wherein the voltage divider includes a low-side resistor for reduction of leakage current.

5. The power-on reset circuit according to claim 1, wherein the voltage divider includes a compensate circuit operative to adjust a feedback current to restore a voltage at the input of the Schmitt-trigger circuit, in response to a fluctuation in the supply signal.

6. The power-on reset circuit according to claim 1, wherein the first voltage is greater than zero and the second voltage is less than the firs voltage.

7. The power-on reset circuit according to claim 1, wherein the Schmitt bigger circuit further comprises a reset signal node operative to rise from a ground potential to a first potential in response to an increase of the supply signal when the supply signal has compared favorably to a first threshold voltage, and to drop from the first potential to the ground potential when the supply signal has not compared favorably to the first threshold voltage, if the Schmitt trigger circuit has not entered the sleep mode.

8. The power-on reset circuit according to claim 1, wherein the Schmitt trigger circuit further comprises a reset signal node having a first voltage peak when the Schmitt trigger circuit enters the power-down mode and having a second voltage peak, which is greater than the first voltage peak, when the Schmitt trigger circuit exits the power-down mode.

9. The power-on reset circuit according to claim 8, wherein the reset signal node further has a third voltage when the Schmitt trigger circuit enters and exits the sleep mode and wherein the third voltage is less than the first voltage peak.

10. A computer system comprising:
a microprocessor;
a bus coupled to the microprocessor;
a memory coupled to the bus; and
the power-on reset circuit of claim 1 operative to generate a power-on reset signal to the microprocessor.

11. The computer system of claim 10, wherein the power-on reset circuit further comprises a compensate circuit operatively coupled to the Schmitt trigger circuit for generating a reset pulse to compensate for temperature and a supply signal variation effect.

12. The computer system of claim 10, wherein the voltage divider includes a current source transistor operative to generate a current in response to the supply signal.

13. The computer system of claim 10, wherein the voltage divider includes a low-side resistor for reduction of leakage current.

14. The computer system of claim 10, wherein the voltage divider includes a compensate circuit operative to adjust a feedback current to restore a voltage at the input of the Schmitt-trigger circuit, in response to a fluctuation in temperature.

15. The computer system of claim 10, wherein the Schmitt trigger circuit further comprises a reset signal node operative to rise from a ground potential to a first potential in response to an increase of the supply signal when the supply signal has compared favorably to a first threshold voltage, and to drop from the first potential to the ground potential when the supply signal has not compared favorably to the first threshold voltage, if the Schmitt trigger circuit has not entered the sleep mode.

16. The computer system of claim 10, wherein the Schmitt trigger circuit further comprises a reset signal node operative to rise from a ground potential to a first potential in response to a change of the supply signal during either a power-up or power-down mode but not during an entering or exiting of the sleep mode.

17. The computer system of claim 16, wherein:
the reset signal node is operative to rise from the ground potential to the first potential in response to a change of the supply signal during the power-up mode and to rise from the ground potential to a second potential in response to another change of the supply signal during the power-down mode; and
the first potential is greater than the second potential.

18. The computer system of claim 10, wherein:
the Schmitt trigger circuit further comprises a reset signal node operative to rise from a ground potential to a first potential in response to a change of the supply signal during a power-up mode and to rise from a ground potential to a second potential in response to another change of the supply signal during a power-down mode; and
the first potential is greater than the second potential.

19. A method for providing a reset signal in response to a supply signal, the method comprising:
generating a primary current in response to the supply signal;
generating a trigger voltage in response to the primary current;
if a sleep mode has not been entered and the supply signal has not compared favorably to a first threshold level, increasing the reset signal from a reference potential to a first potential in response to an increase in the supply signal; and
if the sleep mode has been entered and the supply signal has compared favorably to the first threshold level, setting the reset signal to the reference potential;
wherein the reset signal is increased from the reference potential to the first potential in response to the increase in the supply signal when a power-up state is entered and is increased from the reference potential to a second potential in response to a decrease in the supply signal when a power-down stale is entered, the first potential being greater than the second potential.

20. The method for providing a reset signal in response to a supply signal of claim 19, further comprising compensating the trigger voltage in response to a change in temperature, wherein the compensating of the trigger voltage in response to a change in temperature includes:
providing a primary current path having a path current corresponding to the primary current and the trigger voltage; and
in a circuit having a complementary temperature coefficient with respect to a current source for generating the primary current, adjusting the path current of the primary current path to compensate the pat current for temperature-dependent current variations.

21. The method for providing a reset signal in response to a supply signal of claim 20, wherein the adjusting of the path current of the primary current path to compensate the path current for temperature-dependent current variations includes:
providing a compensation path in parallel to a low-end portion of the primary current path; and
increasing a compensation current in the compensation path in response to a decrease in the primary current, and
decreasing the compensation current in the compensation path in response to an increase in the primary current.

22. A method for providing a reset signal in response to a supply signal, the method comprising:
generating a primary current in response to the supply signal;
generating a trigger voltage in response to the primary current;
if a sleep mode has not been entered and the supply signal has not compared favorably to a first threshold level, increasing the reset signal from a reference potential to a first potential in response to an increase in the supply signal; and
if the sleep mode has not been entered and the supply signal has compared favorably to the first threshold level, setting the reset signal to the reference potential;
wherein the reset signal is increased from the reference potential to first potential in response to the increase in the supply signal when a power-up state is entered, the reset signal is increased from the reference potential to a second potential in response to a decrease in the supply signal when a power-down state is entered, and the first potential is greater than the second potential.

23. The method for providing a reset signal in response to a supply signal of claim 22, further comprising compensating the trigger voltage in response to a change in temperature, wherein the compensating of the trigger voltage in response to a change in temperature includes:
providing a primary current pat having a pat current corresponding to the primary current and the trigger voltage; and
in a circuit having a complementary temperature coefficient with respect to a current source, adjusting the path current of the primary current pat to compensate the path current for temperature-dependent current variations.

24. The method for providing a reset signal in response to a supply signal of claim 23, wherein the adjusting of the path current of the primary current path to compensate the path current for temperature-dependent current variations includes:
  providing a compensation path in parallel to a low-end portion of the primary current path; and
  increasing a compensation current in the compensation path in response to a decrease in the primary current, and decreasing the compensation current in the compensation path in response to an increase in the primary current.

25. A power-on reset circuit, comprising:
  a Schmitt trigger circuit constructed with a plurality of MOS devices, each of said devices having the same $V_t$, for determining a power reset trigger level; and
  a voltage divider connected to a input, and not controlled by an output, of the Schmitt-trigger circuit and configured to track a supply signal, the voltage divider comprising resistors connected directly to the Schmitt trigger circuit; and
  a compensate circuit operatively coupled to the Schmitt trigger circuit for generating a reset pulse to compensate for temperature and a supply signal variation effect.

26. A power-on reset circuit, comprising:
  a Schmitt trigger circuit constructed with a plurality of MOS devices, each of said devices having the same $V_t$, for determining a power reset trigger level; and
  a voltage divider connected to an input and not controlled by an output, of the Schmitt-trigger circuit and configured to track a supply signal, the voltage divider comprising resistors connected directly to the Schmitt trigger circuit, wherein the voltage divider further includes a current source transistor operative to generate a current in response to the supply signal.

27. The power-on reset circuit according to claim 26, wherein the resistors of the voltage divider include a low-side resistor for reduction of leakage current.

28. A power-on reset circuit, comprising:
  a Schmitt trigger circuit constructed with a plurality of MOS devices, each of said devices having the same $V_t$, for determining a power reset trigger level; and
  a voltage divider connected to an input, and not controlled by an output, of the Schmitt-trigger circuit and configured to track a supply signal, the voltage divider comprising resistors connected directly to the Schmitt trigger circuit, wherein the voltage divider further includes a compensate circuit operative to adjust a feedback current to restore a voltage at the input of the Schmitt-trigger circuit, in response to a fluctuation in the supply signal.

29. The power-on reset circuit according to claim 28, wherein the Schmitt trigger circuit further comprises a threshold-enhancement node having a first voltage greater than zero when the Schmitt trigger circuit enters and exits a power-down mode and having a second voltage less than the first voltage when the Schmitt trigger circuit enters and exits a sleep mode.

30. The A power-on reset circuit, comprising:
  a Schmitt trigger circuit constructed with a plurality of MOS devices, each of said devices having the same $V_t$, for determining a power reset trigger level; and
  a voltage divider connected to an input, and not controlled by an output, of the Schmitt-trigger circuit and configured to track a supply signal, the voltage divider comprising resistors connected directly to the Schmitt trigger circuit, wherein the Schmitt trigger circuit further comprises a reset signal node operative to rise from a ground potential to a first voltage in response to an increase of the supply signal when the supply signal has compared favorably to a first threshold voltage, and to drop from the first voltage to the ground potential when the supply signal has not compared favorably to the first threshold voltage, if the Schmitt trigger circuit has not entered a sleep mode.

31. A power-on reset circuit, comprising:
  a Schmitt trigger circuit constructed with a plurality of MOS devices, each of said devices having the same $V_t$, for determining a power reset trigger level; and
  a voltage divider connected to an input, and not controlled by an output of the Schmitt-trigger circuit and configured to track a supply signal, the voltage divider comprising resistors connected directly to the Schmitt trigger circuit, wherein the Schmitt trigger circuit further comprises a reset signal node having a first voltage peak when the Schmitt trigger circuit enters a power-down mode and having a second voltage peak, which is greater than the first voltage peak, when the Schmitt trigger circuit exits the power-down mode.

32. The power-on reset circuit according to claim 31, wherein the reset signal node further has a third voltage when the Schmitt trigger circuit enters and exits a sleep mode and wherein the third voltage is less than the first voltage peak.

33. A power-on reset circuit, comprising:
  a Schmitt trigger circuit constructed with a plurality of MOS devices, each of said devices having the same $V_t$, for determining a power reset trigger level;
  a voltage divider connected to an input of the Schmitt-trigger circuit and configured to track a supply signal, and comprising a compensate circuit operatively coupled to the Schmitt trigger circuit for generating a reset pulse to compensate for temperature and a supply signal variation effect; and
  a node having a first potential corresponding to a power-down mode of the Schmitt trigger circuit and having a second potential corresponding to a sleep mode of the Schmitt trigger circuit.

34. A power-on reset circuit, comprising:
  a Schmitt trigger circuit constructed with a plurality of MOS devices, each of said devices having the same $V_t$, for determining a power reset trigger level;
  a voltage divider connected to an input of the Schmitt-trigger circuit and configured to track a supply signal, wherein the voltage divider includes a current source transistor operative to generate a current in response to the supply signal; and
  a node having a first potential corresponding to a power-down mode of the Schmitt trigger circuit and having a second potential corresponding to a sleep mode of the Schmitt trigger circuit.

35. A power-on reset circuit, comprising:
  a Schmitt trigger circuit constructed with a plurality of MOS devices, each of said devices having the same $V_t$, for determining a power reset trigger level;
  a voltage divider connected to an input of the Schmitt-trigger circuit and configured to track a supply signal, wherein the voltage divider includes a compensate circuit operative to adjust a feedback current to restore a voltage at the input of the Schmitt-trigger circuit in response to a fluctuation in the supply signal; and a node having a first potential corresponding to a power-down mode of the Schmitt trigger circuit and having a second potential corresponding to a sleep mode of the Schmitt trigger circuit.

36. A power-on reset circuit, comprising:

a Schmitt trigger circuit constructed with a plurality of MOS devices, each of said devices having the same $V_t$, for determining a power reset trigger level;

a voltage divider connected to an input of the Schmitt-trigger circuit and configured to track a supply signal, wherein the Schmitt trigger circuit further comprises a reset signal node operative to rise from a ground potential to a first voltage in response to an increase of to supply signal when the supply signal has compared favorably to a first threshold voltage, and to drop from the first voltage to the ground potential when the supply signal has not compared favorably to the first threshold voltage, if the Schmitt trigger circuit has not entered a sleep mode; and a node having a first potential corresponding to a power-down mode of the Schmitt trigger circuit and having a second potential corresponding to a sleep mode of the Schmitt trigger circuit.

37. A power-on reset circuit, comprising:

a Schmitt trigger circuit constructed with a plurality of MOS devices, each of said devices having the same $V_t$, for determining a power reset trigger level;

a voltage divider connected to an input of the Schmitt-trigger circuit and configured to track a supply signal, wherein the Schmitt trigger circuit further comprises a reset signal node having a first voltage peak when the Schmitt trigger circuit enters a power-down mode and having a second voltage peak, which is greater than the first voltage peak, when the Schmitt trigger circuit exits the power-down mode; and a node having a first potential corresponding to a power-down mode of the Schmitt trigger circuit and having a second potential corresponding to a sleep mode of the Schmitt trigger circuit.

* * * * *